United States Patent
Yoo et al.

(10) Patent No.: US 8,710,513 B2
(45) Date of Patent: Apr. 29, 2014

(54) LIGHT-EMITTING DEVICE PACKAGE AND METHOD OF MANUFACTURING THE SAME

(75) Inventors: Cheol-jun Yoo, Chungcheongnam-do (KR); Young-hee Song, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 132 days.

(21) Appl. No.: 13/365,922

(22) Filed: Feb. 3, 2012

(65) Prior Publication Data
US 2012/0205699 A1 Aug. 16, 2012

(30) Foreign Application Priority Data
Feb. 16, 2011 (KR) .................. 10-2011-0013679

(51) Int. Cl.
*H01L 33/62* (2010.01)
(52) U.S. Cl.
USPC .... 257/81; 257/99; 257/E33.077; 257/E33.058; 438/22; 438/24
(58) Field of Classification Search
USPC ......... 257/81, 99, E33.077, E33.058; 438/22, 438/24
See application file for complete search history.

(56) References Cited

U.S. PATENT DOCUMENTS

| | | | |
|---|---|---|---|
| 7,518,158 B2 * | 4/2009 | Keller et al. .................... 257/98 |
| 2006/0018608 A1 | 1/2006 | Mizoguchi |
| 2006/0027479 A1 | 2/2006 | Auburger et al. |
| 2006/0054901 A1 | 3/2006 | Shoji et al. |
| 2006/0055012 A1 * | 3/2006 | Hsin Chen et al. ........... 257/678 |
| 2007/0090488 A1 | 4/2007 | Teng et al. |
| 2007/0257901 A1 | 11/2007 | Gotou et al. |
| 2008/0298063 A1 | 12/2008 | Hayashi |
| 2010/0133571 A1 | 6/2010 | Kawasaki et al. |
| 2011/0012151 A1 | 1/2011 | Ono |
| 2011/0031513 A1 | 2/2011 | Hsieh et al. |

FOREIGN PATENT DOCUMENTS
KR 10-2007-0094280 A 9/2007

OTHER PUBLICATIONS

Extended European Search Report issued in European Patent Application No. EP 12155685.6 dated Nov. 25, 2013.

\* cited by examiner

*Primary Examiner* — Minh-Loan T Tran
(74) *Attorney, Agent, or Firm* — McDermott Will & Emery LLP

(57) ABSTRACT

A light-emitting device package and a method of manufacturing the light-emitting device package. The light-emitting device package includes a wiring substrate; a Zener diode mounted on a first region of the wiring substrate; a light-emitting device chip mounted on the first region and a second region of the wiring substrate; and a molding member for fixing at least a portion of the wiring substrate, wherein the Zener diode is embedded in the molding member.

25 Claims, 16 Drawing Sheets

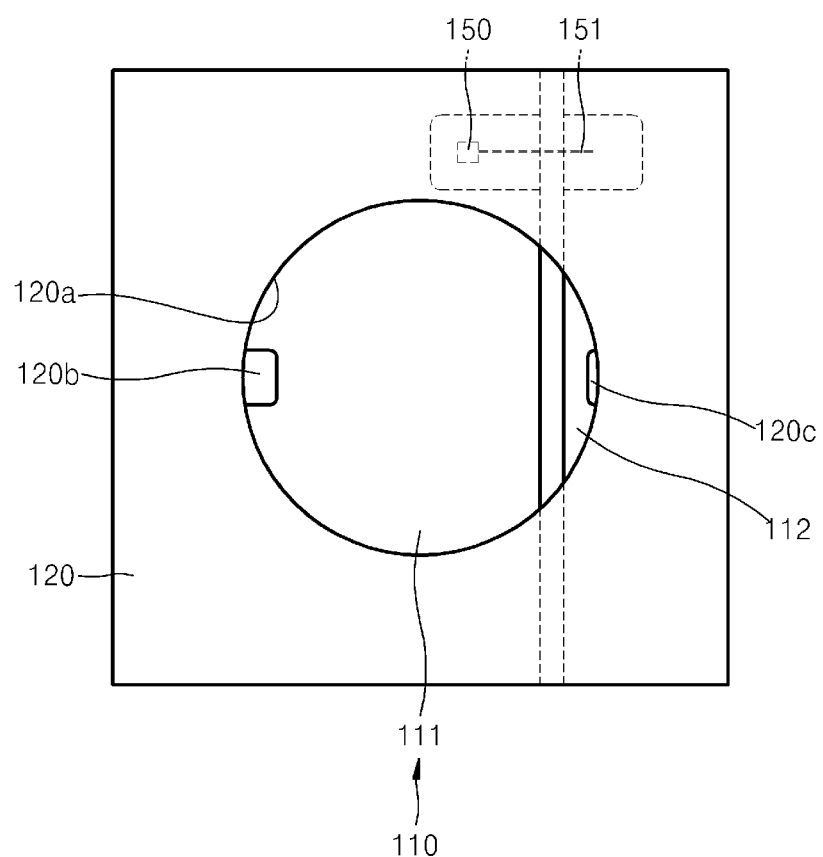

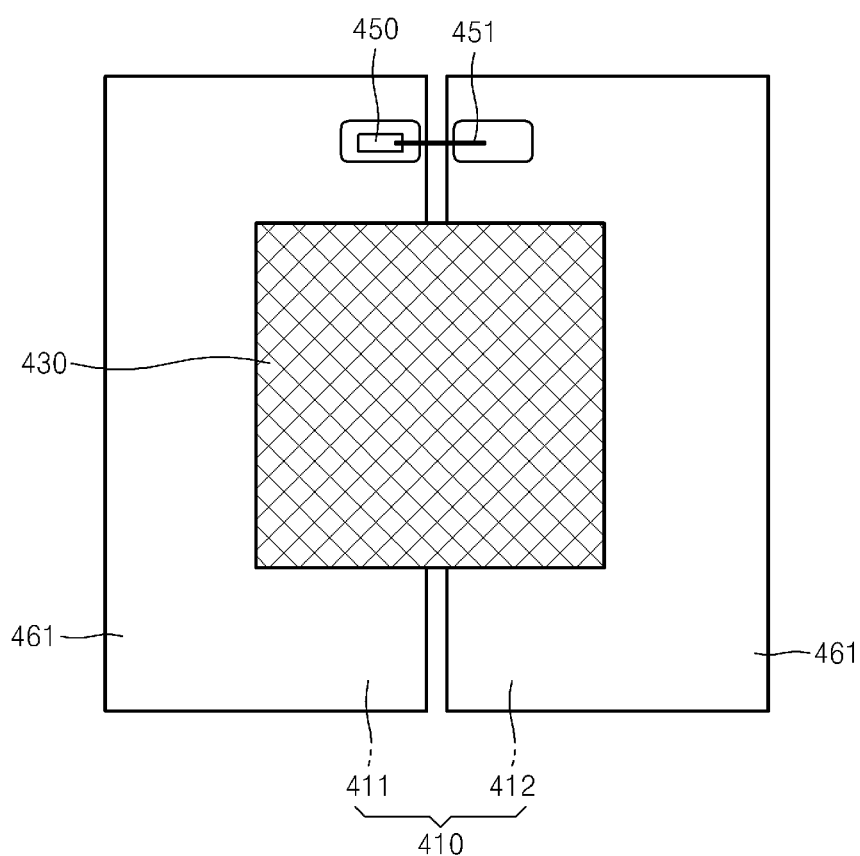

LIGHT-EMITTING DEVICE PACKAGE AND METHOD OF MANUFACTURING THE SAME

CROSS-REFERENCE TO RELATED APPLICATIONS

This application claims the benefit of Korean Patent Application No. 10-2011-0013679, filed on Feb. 16, 2011, in the Korean Intellectual Property Office, the disclosure of which is incorporated herein in its entirety by reference.

BACKGROUND

1. Field

The present disclosure relates to light-emitting device packages and methods of manufacturing the same, and more particularly, to light-emitting device packages including a Zener diode and methods of manufacturing the same.

2. Description of the Related Art

Semiconductor light-emitting devices such as a light-emitting diode (LED) or a laser diode (LD) operate using an electroluminescence phenomenon, that is, a phenomenon that light is emitted from a material (semiconductor) to which a current or a voltage is applied, and are manufactured using compound semiconductors. For example, a nitride gallium-based light-emitting device is widely used as a high efficiency and high luminance device.

A light-emitting device package such as a LED includes a light-emitting device chip, and a Zener diode installed on a lateral surface of the light-emitting device chip. The Zener diode has properties that a current flows through the Zener diode in an opposite direction when an electric potential difference is applied to the Zener diode in the opposite direction. When an overvoltage is generated in the Zener diode, a light-emitting device chip may be protected from the overvoltage by using this property of the Zener diode.

SUMMARY

Provided are light-emitting device packages including a Zener diode and having an improved molding structure, and methods of manufacturing the same.

Additional aspects will be set forth in part in the description which follows and, in part, will be apparent from the description, or may be learned by practice of the presented embodiments.

According to an aspect of the present invention, a light-emitting device package includes a wiring substrate; a Zener diode mounted on a first region of the wiring substrate; a light-emitting device chip mounted on a second region of the wiring substrate, the second region being different from the first region; and a molding member for fixing at least a portion of the wiring substrate, wherein the Zener diode is embedded in the molding member.

The first region of the wiring substrate may be formed to be concave with a step difference, or may be concave and bent. In this case, a depth of the first region of the wiring substrate may be the same or greater than a height of the Zener diode.

A connection member for electrically connecting the Zener diode and the wiring substrate to each other may be embedded in the molding member. The connection member may be a bonding wire.

The molding member may surround the wiring substrate, except for the second region. In addition, the molding member may be formed to directly contact a lateral surface of the light-emitting device chip.

An upper surface of the molding member may be uniformly formed flat.

Light-emitting device chip may be connected to the wiring substrate through a bonding wire. In this case, the bonding wire may be attached to a surface of the wiring substrate, on which the light-emitting device chip is attached, and is embedded in the molding member. In addition, the bonding wire may be attached to an opposite surface to a surface of the wiring substrate, on which the light-emitting device chip is attached.

The light-emitting device chip may be bonded to the wiring substrate by using a flip-chip bonding method.

At least one through-hole may be formed in the first region, the second region, and a third region of the wiring substrate, and the modifying member is filled in the at least one through-hole.

The at least one through-hole may be formed so that an upper portion of the at least one through-hole is wider than a lower portion of the at least one through-hole or the lower portion of the at least one through-hole is wider than the upper portion of the at least one through-hole.

The light-emitting device package may further include a phosphor layer formed on an emissive surface of the light-emitting device chip.

The light-emitting device package may further include a lens disposed on an emissive surface of the light-emitting device chip.

The wiring substrate may include at least two leads that are electrically insulated from each other.

The light-emitting device package may further include a solder bump formed on the lower surface of the wiring substrate.

According to another aspect of the present invention, a method of manufacturing a light-emitting device package includes preparing a wiring substrate; disposing a Zener diode on a first region of the wiring substrate; disposing a light-emitting device chip on a second region of the wiring substrate, the second region being different from the first region; and forming a molding member so as to fix the wiring substrate, wherein the Zener diode is embedded in the molding member.

The preparing of the wiring substrate may include performing half-etching on the first region of the wiring substrate so that the first region is concave. The preparing of the wiring substrate may include bending the wiring substrate so that the first region is concave. In this case, a depth of the first region may be the same or greater than a height of the mounted Zener diode or a height of the mounted Zener diode.

The forming of the molding member may be performed prior to the disposing of the light-emitting device chip. The forming of the molding member may be performed after the light-emitting device chip is disposed.

According to the above-described light-emitting device package and the method of manufacturing the same, an emissive area of the light-emitting device package may be maximized by embedding a Zener diode in a mold member. A member (e.g., a bonding wire) for electrically connecting the Zener diode to a wiring substrate is embedded in the mold member, thereby improving the reliability of the Zener diode in terms of electrical connection. In addition, the light-emitting device package may be easily miniaturized.

BRIEF DESCRIPTION OF THE DRAWINGS

These and/or other aspects will become apparent and more readily appreciated from the following description of the embodiments, taken in conjunction with the accompanying drawings of which:

FIGS. 4A through 4C are plan views for explaining a method of manufacturing the light-emitting device package of FIG. 1, according to an embodiment of the present invention;

FIGS. 14A through 14D are plan views for explaining a method of manufacturing the light-emitting device package of FIG. 11, according to another embodiment of the present invention.

DETAILED DESCRIPTION

Figure 1:
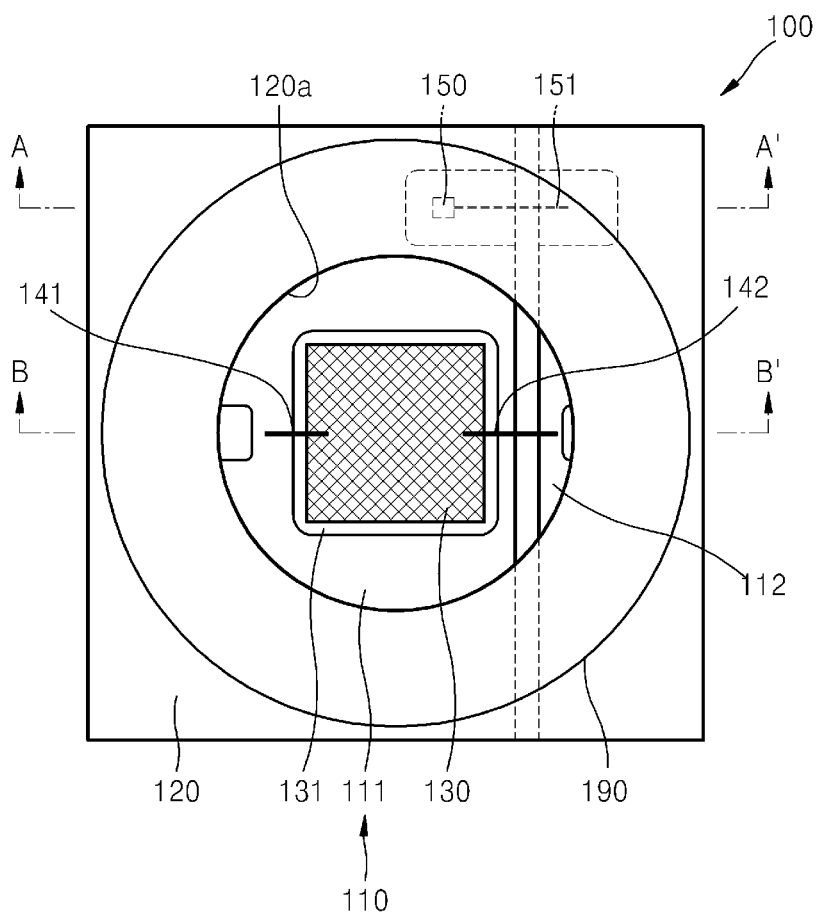
FIG. 1 is a schematic plan view of a light-emitting device package according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. In the drawings, the thicknesses of layers and regions are exaggerated for clarity, and like reference numerals in the drawings denote like elements.

Figure 2:
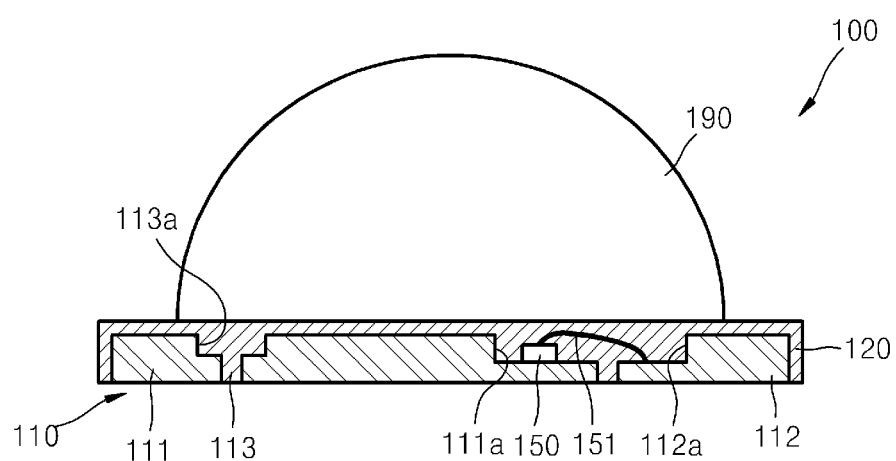
FIG. 2 is a side cross-sectional view of the light-emitting device package taken along a line A-A' of FIG. 1.
Figure 3:
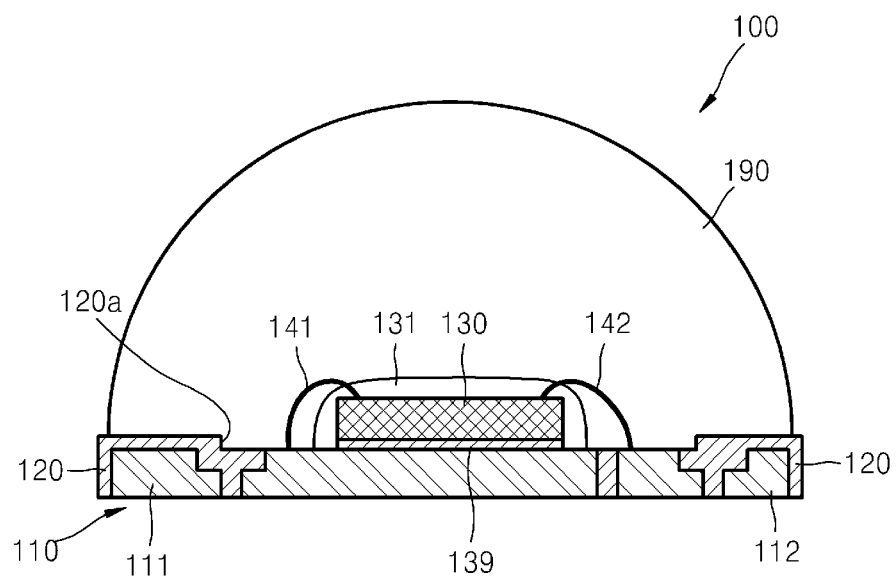
FIG. 3 is a side cross-sectional view of the light-emitting device package taken along a line B-B' of FIG. 1.

FIG. 1 is a schematic plan view of a light-emitting device package 100 according to an embodiment of the present invention. FIG. 2 is a side cross-sectional view of the light-emitting device package 100 taken along a line A-A' of FIG. 1. FIG. 3 is a side cross-sectional view of the light-emitting device package 100 taken along a line B-B' of FIG. 1.

Referring to FIGS. 1 through 3, the light-emitting device package 100 includes a wiring substrate 110, a light-emitting device chip 130 and a Zener diode 150 that are mounted on the wiring substrate 110, and a molding member 120 for fixing the wiring substrate 110.

The wiring substrate 110 may be a lead frame including first and second leads 111 and 112 that are separate from each other. The first and second leads 111 and 112 may each be a metal plate having a shape shown in FIG. 4A. At least one through-hole 113 may be formed in the wiring substrate 110, except for regions to which the light-emitting device chip 130 and the Zener diode 150 are attached. The molding member 120 may be filled in the through-hole 113 so as to improve mechanical adhesion between the wiring substrate 110 and the molding member 120. The through-hole 113 may be formed so that an upper portion thereof may be wider than a lower portion thereof. In this case, the upper portion of the through-hole 113 is at a side of the wiring substrate 10 to which the light-emitting device chip 130 is attached. For example, as shown in FIG. 2, the through-hole 113 may be formed with a step difference 113a so that an upper portion thereof is wider than a lower portion thereof. The step difference 113a of the through-hole 113 may further improve the mechanical adhesion between the wiring substrate 110 and the molding member 120 and may minimize a reduction of an area of a lower surface of the wiring substrate 110 due to the through-hole 113, thereby preventing an increase in the heat dissipation efficiency of the light-emitting device package 100.

Two electrodes of the light-emitting device chip 130 are electrically connected to the first and second leads 111 and 112 that are separate from each other. In addition, two electrodes of the Zener diode 150 are electrically connected to the first and second leads 111 and 112. Furthermore, the first lead 111 of the wiring substrate 110 may function as a surface to which the light-emitting device chip 130 and the Zener diode 150 are adhered. The wiring substrate 110 may be a printed circuit board (PCB) substrate, or the like, as well as a lead frame.

As shown in FIG. 1, the molding member 120 seals a region of the wiring substrate 110 except for an opening 120a. In this case, the first and second leads 111 and 112 that are separate from each other are insulated from each other by the molding member 120, and are fixed by the molding member 120. Furthermore, as described below, the Zener diode 150 and a bonding wire 151 that are attached to the wiring substrate 110 are sealed. In FIG. 1, the opening 120a has a circular shape, but is not limited thereto. For example, the opening 120a may have various shapes such as a square shape, a rectangular shape, or the like.

The molding member 120 may be formed of a white molding material having excellent light reflectivity. For example, the molding member 120 may be formed by mixing a material $TiO_2$ with a molding resin. According to circumstances, the molding member 120 may be formed of a molding material with a black color or other colors, as well as a white molding material.

The light-emitting device chip 130 may be, for example, a light-emitting diode (LED) or a laser diode (LD). As shown in FIG. 1, the light-emitting device chip 130 is disposed in the opening 120a that is not sealed by the molding member 120. The light-emitting device package 100 is a pre-mold type package which is formed by forming the molding member 120 prior to attaching the light-emitting device chip 130 and then attaching the light-emitting device chip 130 to the opening 120a.

The light-emitting device chip 130 may be fixed onto the first lead 111 of the wiring substrate 110 by using an adhesive layer 139 (see FIG. 3). The light-emitting device chip 130 may be electrically connected to exposed portions of the first and second leads 111 and 112 through bonding wires 141 and 142, respectively. In addition, a phosphor layer 131 may be further formed on an emissive surface of the light-emitting device chip 130, which is an upper surface of the light-emitting device chip 130. Phosphor in the phosphor layer 131 is excited by light emitted from the light-emitting device chip 130 so as to emit a white light beam. To this end, the phosphor layer 131 may be formed by dispersing a single type of phosphor or different types of phosphors in a resin in a predetermined mix ratio. The type and mix ratio of phosphors dispersed in a resin such as a Si resin or an epoxy resin may be determined according to the emitting characteristics of the light-emitting device chip 130. The phosphor layer 131 may be formed entirely on the emissive surface of the light-emitting device chip 130, which is an upper surface of the light-emitting device chip 130. However, if a white light beam does not have to be emitted, the phosphor layer 131 may be omitted. According to circumstances, the phosphor layer 131 may be embodied as a film and the film may be attached to an emissive surface of the light-emitting device chip 130.

The Zener diode 150 and the bonding wire 151 that is an electrical connection member are embedded in an outer region of the opening 120a, that is, in the molding member 120.

When an electric potential difference greater than or equal to a Zener voltage is applied to the Zener diode 150 in an opposite direction, a electric current flows through the Zener diode 150 in the opposite direction. A first electrode of the Zener diode 150 is electrically connected to the first lead 111 directly. A second electrode of the Zener diode 150 is electrically connected to the second lead 112 through the bonding wire 151. That is, the Zener diode 150 is connected in parallel to the light-emitting device chip 130. Thus, when an overvoltage is generated, since a electric current flows through the Zener diode 150, the Zener diode 150 protects the light-emitting device chip 130 from the overvoltage.

The opening 120a is divided into a region to which the light-emitting device chip 130 is attached and a surrounding region of the light-emitting device chip 130, on which a bonding wire pad is provided for electrical connection of the light-emitting device chip 130. The region to which the light-emitting device chip 130 is attached is a region from which light is emitted due to the light-emitting device chip 130. In the opening 120a, since the first and second leads 111 and 112 are exposed such that light may be reflected by the first and second leads 111 and 112, the surrounding region of the light-emitting device chip 130 may function as a reflective region. According to the present embodiment, the light-emitting device package 100 is disposed in the outer region of the opening 120a, that is, in the molding member 120, the opening 120a may be maximally used as an emissive region and a reflective region. That is, in the light-emitting device package 100, since the opening 120a is used to mount the light-emitting device chip 130 only, the size of an emissive surface of the light-emitting device chip 130 may be relatively large, or the size of the light-emitting device package 100 may be relatively small. In addition, the opening 120a may function as a reflective region, except for the region to which the light-emitting device chip 130 is attached, and thus, light efficiency of the light-emitting device package 100 may be improved. On the other hand, with regard to a typical pre-mold type light-emitting device package, a wiring substrate is sealed by a mold member and then a light-emitting device chip and a Zener diode are attached to an opening of a mold member. In the typical pre-mold type light-emitting device package, since the Zener diode and a wire bonding pad for electrical connection of the Zener diode occupy a portion of the opening, the opening may not be maximally used as an emissive region and a reflective region.

In addition, since the bonding wire 151 functioning as a wire of the Zener diode 150 is sealed by the molding member 120, the reliability of the Zener diode 150 may be improved in terms of electrical connection. On the other hand, with regard to a typical pre-mold type light-emitting device package, since a bonding wire is sealed in a binder resin in which a phosphor is dispersed, it is difficult to ensure the reliability of the bonding wire in terms of electrical connection in a high-temperature/high-humidity environment. For example, thermal expansion coefficients of a phosphor and a binder resin are different from each other, and thus the bonding wire may be deformed.

As shown in FIG. 2, groove portions 111a and 112a that are formed to be concaved with a step difference and to have a predetermined depth may be formed in the first and second leads 111 and 112, respectively. The groove portion 111a of the first lead 111 may be a region on which the Zener diode 150 is mounted. The groove portion 112a of the second lead 112 may be a region to which the bonding wire 151 connected to the Zener diode 150 is attached. The groove portions 111a and 112a may have a depth that is equal to or greater than a height of the mounted Zener diode 150. That is, the groove portions 111a and 112a may have a depth that is equal to or greater than a height of each of the Zener diode 150 and the bonding wire 151 for electrical connection thereof. Thus, the Zener diode 150 and the bonding wire 151 do not protrude above upper surfaces of the first and second leads 111 and 112, a thickness of the molding member 120 may be minimized, and an upper surface of the molding member 120 may be uniformly formed flat.

According to the present embodiment, the groove portions 111a and 112a are formed in the first and second leads 111 and 112, respectively. Alternatively, the groove portions 111a and 112a may be omitted. In this case, since the Zener diode 150 protrudes above the upper surfaces of the first and second leads 111 and 112, the molding member 120 may have a protruding portion corresponding to the Zener diode 150 or may be formed to be relatively thick.

A method of manufacturing the light-emitting device package 100, according to an embodiment of the present invention, will now be described with reference to FIGS. 4A through 4C.

Figure 4A:
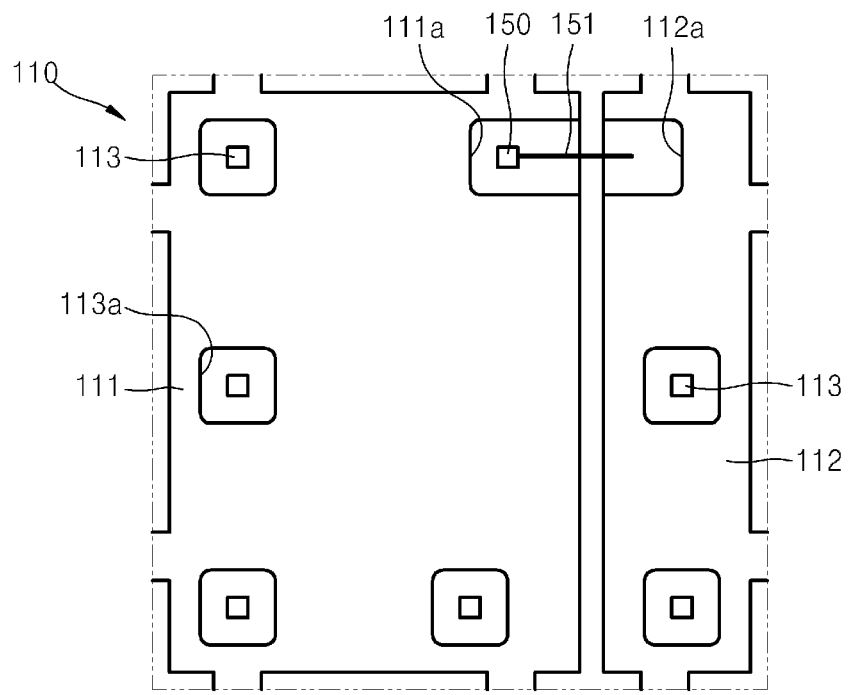

Referring to FIG. 4A, the wiring substrate 110 is prepared. The wiring substrate 110 may be a lead frame that is processed to have a shape corresponding to the first and second leads 111 and 112 by using an etching method. The groove portions 111a and 112a may be formed by half-etching a region on which the Zener diode 150 of the first lead 111 is to be disposed and a region on which the Zener diode 150 of the second lead 112 is connected by the bonding wire 151. Furthermore, through-holes 113 may be formed in the first and second leads 111 and 112, except for a region on which a light-emitting device chip 130 (see FIG. 4) is disposed and a region on which the Zener diode 150 is disposed. Each through-hole 113 may be formed with the step difference 113a so that an upper portion thereof is wider than a lower portion thereof by using two-step etching. According to circumstances, the through-hole 113 may be formed with a step difference so that a lower portion thereof is narrower than an upper portion thereof.

The Zener diode 150 is attached to the groove portion 111a of the first lead 111. For example, the first and second electrodes of the Zener diode 150 may be formed on upper and lower surfaces thereof, respectively. In this case, the first electrode is connected to the first lead 111 by attaching the Zener diode 150 to the groove portion 111a of the first lead 111. The second electrode of the Zener diode 150 is electrically connected to the groove portion 112a of the second lead 112 via the bonding wire 151.

Then, referring to FIG. 4B, the molding member 120 is formed on the wiring substrate 110 by using an injection process. That is, the light-emitting device package 100 according to the present embodiment is a pre-molding type package formed by forming the molding member 120 prior to attaching the light-emitting device chip 130 (see FIG. 4C). For example, the molding member 120 may be formed using an injection molding method of positioning the wiring substrate 110 in a mold and performing transfer molding. In this case, the molding member 120 may be formed to couple and fix the first and second leads 111 and 112 to each other and to completely seal the Zener diode 150 and the bonding wire 151. For example, the molding member 120 may be formed on entire upper and lateral surfaces of the wiring substrate 110, except for the opening 120a. A lower surface of the wiring substrate 110 may be exposed so as to be used as a component for dissipating heat and as a terminal for electrical connection with an external component. The molding member 120 may fill a space between the first and second leads 111 and 112, or the through-hole 113. In FIG. 4B, reference numerals 120b and 120c denote molding members filling the through-holes 113 of the first and second leads 111 and 112.

Figure 4C:
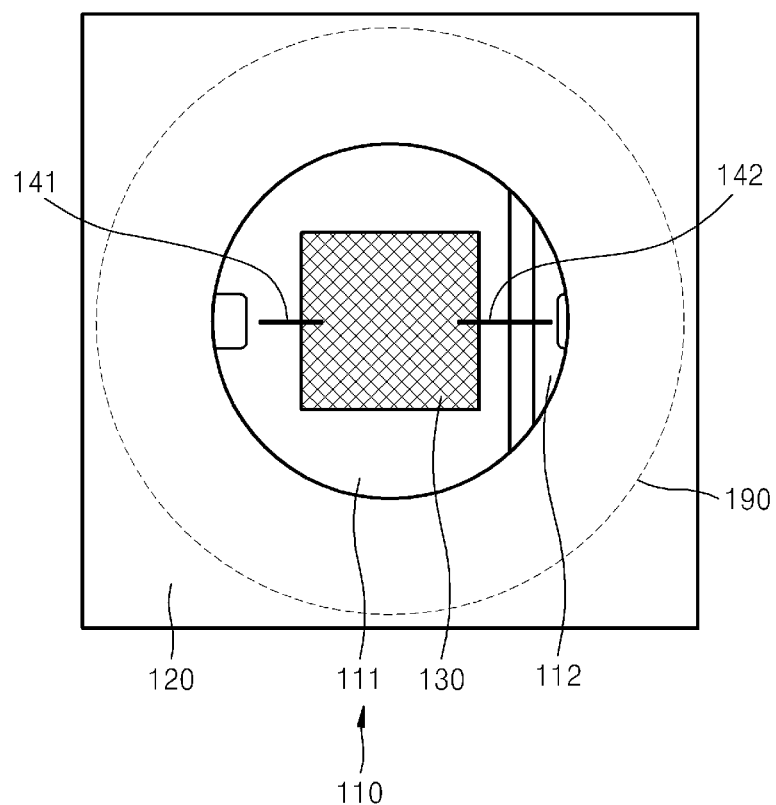

Then, referring to FIG. 4C, the light-emitting device chip 130 is bonded to the wiring substrate 110, on which the molding member 120 is formed, by using a die-bonding method, and is bonded to the wiring substrate 10 by using a wire-bonding method using the bonding wires 141 and 142. Prior to performing of the bonding methods of the light-emitting device chip 130, the adhesive layer 139 (see FIG. 3) may be formed on a portion of the opening 120a. After the wire-bonding method is performed, the phosphor layer 131 (see FIG. 3) may be formed on an emissive surface of the light-emitting device chip 130, which is the upper surface of the light-emitting device chip 130. Furthermore, a lens 190 that is formed of a transparent material may be formed on the emissive surface of the light-emitting device chip 130. In this case, the lens 190 may be formed of a transparent high-molecular weight molding material by using an injection molding method so as to seal both the light-emitting device chip 130 and the bonding wires 141 and 142. According to circumstances, the lens 190 that is previously prepared may be attached to the molding member 120. In FIG. 2, the lens 190 has a hemispherical shape, but is not limited thereto. The shape of the lens 190 may differ according to the required directivity of light.

Figure 5:
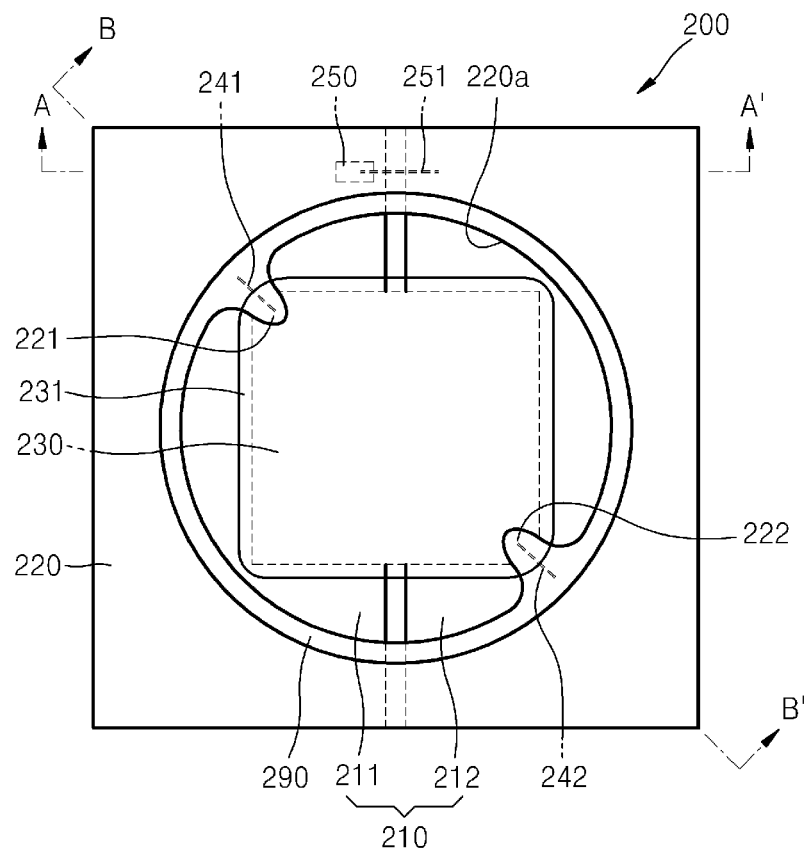
FIG. 5 is a schematic plan view of a light-emitting device package according to another embodiment of the present invention.
Figure 6:
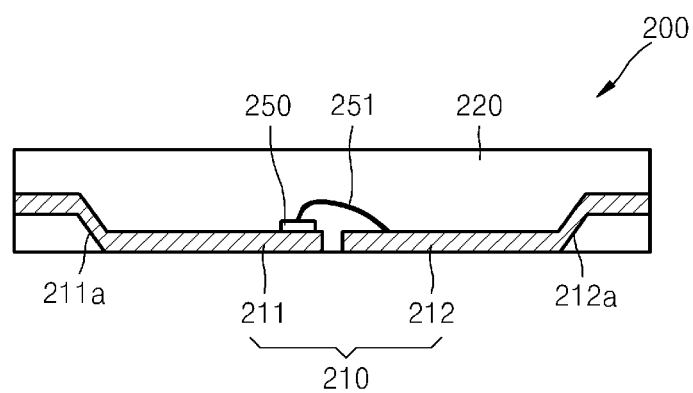
FIG. 6 is a side cross-sectional view of the light-emitting device package taken along a line A-A' of FIG. 5.
Figure 7:
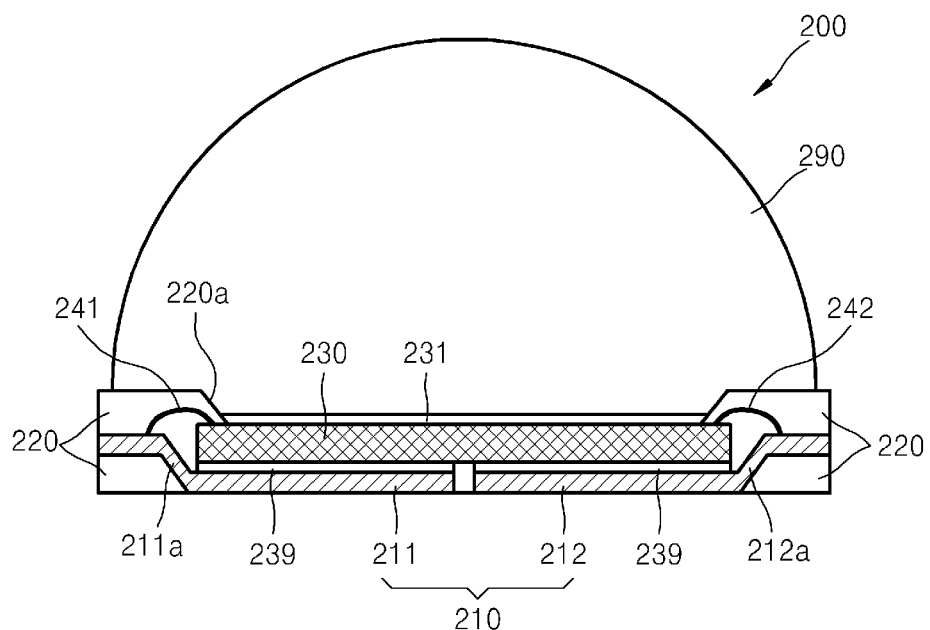
FIG. 7 is a side cross-sectional view of the light-emitting device package taken along a line B-B' of FIG. 5.

FIG. 5 is a schematic plan view of a light-emitting device package 200 according to another embodiment of the present invention. FIG. 6 is a side cross-sectional view of the light-emitting device package 200 taken along a line A-A' of FIG. 5. FIG. 7 is a side cross-sectional view of the light-emitting device package 200 taken along a line B-B' of FIG. 5.

Referring to FIGS. 5 through 7, the light-emitting device package 200 includes a wiring substrate 210, a Zener diode 250 and a light-emitting device chip 230 that are mounted on the wiring substrate 210, and a molding member 220 for fixing the wiring substrate 210.

The wiring substrate 210 may be a lead frame including first and second leads 211 and 212 that are separate from each other. The first and second leads 211 and 212 may each be a metal plate having a shape shown in FIG. 8A. As shown in FIGS. 6 and 7, inner portions of the first and second leads 211 and 212 may be bent downwards. In FIGS. 6 and 7, reference numerals 211a and 212a denote bent portions of the first and second leads 211 and 212, respectively.

The light-emitting device chip 230 and the Zener diode 250 are adhered to the inner portions of the first and second leads 211 and 212. The light-emitting device chip 230 may be fixed onto the wiring substrate 210 by an adhesive layer 239. The light-emitting device chip 230 may be electrically connected to the first and second leads 211 and 212 through bonding wires 241 and 242, respectively. In addition, a first electrode of the Zener diode 250 is electrically connected to the first lead 211 directly. A second electrode of the Zener diode 250 is electrically connected to the second lead 212 through a bonding wire 251. That is, the Zener diode 250 is connected in parallel to the light-emitting device chip 230.

The inner portion of each of the first and second leads 211 and 212 may have a depth that is the same as or similar to a height of each of the Zener diode 250 and the second lead 212 for electrical connection thereof. Thus, a thickness of the molding member 220 for sealing the first and second leads 211 and 212 may be minimized and an upper surface of the molding member 220 may be uniformly formed flat.

The light-emitting device package 200 is a post-mold type package which is formed by forming the molding member 220 after the light-emitting device chip 230 is attached. As shown in FIG. 5, the molding member 220 seals the wiring substrate 210, except for an opening 220a. In this case, the first and second leads 211 and 212 that are separate from each other are insulated from each other by the molding member 220, and are fixed by the molding member 120. Since the first and second leads 211, 212 are bent, upper and lower sides of the first and second leads 211 and 212 are surrounded by the molding member 220 so as to strongly couple the molding member 220 and the first and second leads 211 and 212. In addition, since a lower surface of the inner portions of the first and second leads 211 and 212 are exposed out of the molding member 220, heat emitted from the light-emitting device chip 230 may be easily dissipated.

In addition, the molding member 220 seals the Zener diode 250 and the bonding wire 251. Since the molding member 220 seals the Zener diode 250, the opening 220a may be maximally used as an emissive region and a reflective region, and the light-emitting device package 200 may be easily miniaturized. Since the bonding wire 251 functioning as a wire of the Zener diode 250 is sealed by the molding member 220, the reliability of the Zener diode 250 may be improved in terms of electrical connection.

Furthermore, as shown in FIG. 5, portions 221 and 222 of the molding member 220 protrude inward towards the opening 220a, and thus, the bonding wire 241 for electrically connecting the light-emitting device chip 230 and the first lead 211, and the bonding wire 242 for electrically connecting the light-emitting device chip 230 and the second lead 212 may be sealed by the molding member 220. Thus, the reliability of the light-emitting device package 200 may be improved in terms of electrical connection by sealing the bonding wires 241 and 242 for electrical wiring of the light-emitting device chip 230 using the molding member 220.

A phosphor layer 231 may be further formed on an emissive surface of the light-emitting device chip 230, which is an upper surface of the light-emitting device chip 230. However, if a white light beam does not have to be emitted, the phosphor layer 231 may be omitted. According to circumstances, the phosphor layer 231 may be embodied as a film and may be attached to the emissive surface of the light-emitting device chip 230. In addition, a lens 290 may be disposed on the opening 220a.

A method of manufacturing the light-emitting device package 200, according to another embodiment of the present invention, will now be described with reference to FIGS. 8A through 8C.

Figure 8A:
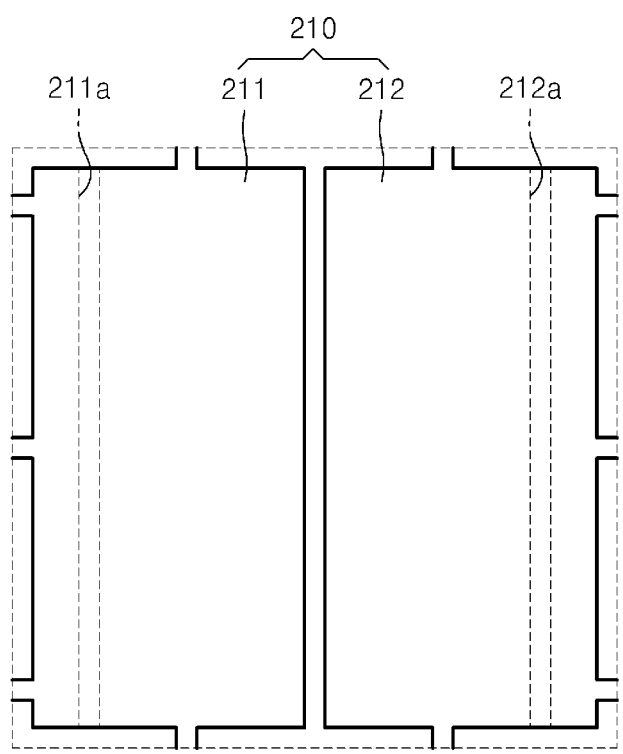
FIGS. 8A through 8C are plan views for explaining a method of manufacturing the light-emitting device package of FIG. 5, according to another embodiment of the present invention.

Referring to FIG. 8A, the wiring substrate 210 is prepared. The wiring substrate 210 may be a lead frame that is processed to have a shape corresponding to the first and second leads 211 and 212 and includes the bent portions 211a and 212a that are formed by forming inner and outer portions of the wiring substrate 210 with a step difference in a longitudinal direction.

Figure 8B:
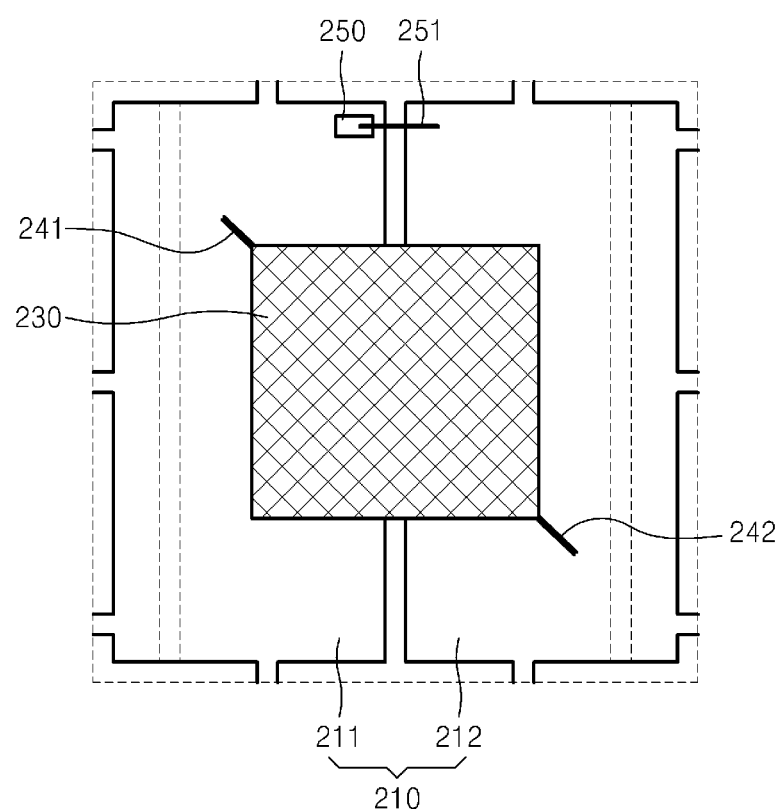

Then, referring to FIG. 8B, the light-emitting device chip 230 and the Zener diode 250 are attached to the wiring substrate 210, and the light-emitting device chip 230 and the Zener diode 250 are bonded to each other by using a wire-bonding method using the bonding wires 241, 242, and 251. Before the light-emitting device chip 230 and the Zener diode 250 are attached to each other, the adhesive layer 239 (see FIG. 5) may be formed on the inner portions of the first and second leads 211 and 212.

Figure 8C:
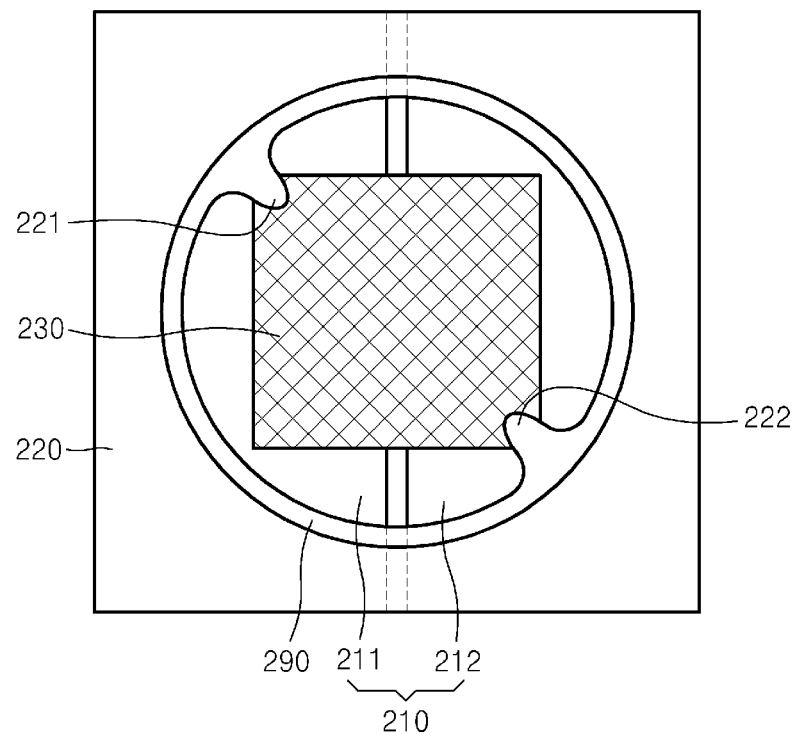

Then, referring to FIG. 8C, the molding member 220 is formed on the wiring substrate 210 by using an injection process. The light-emitting device package 200 according to the present embodiment is a post-mold type package formed by forming the molding member 220 after the light-emitting device chip 230 is attached. In this case, the molding member 220 may be formed to couple and fix the first and second leads 211 and 212 to each other and to completely seal the Zener diode 250 and the bonding wires 241, 242, and 251. In this case, with respect to the bent portions 211a and 212a, the molding member 220 may be formed on only an upper portion of the wiring substrate 210, and both upper and lower portions of the wiring substrate 210 may be surrounded by the molding member 220.

After the molding member 220 is formed, the phosphor layer 231 (see FIG. 5) may be formed on the emissive surface of the light-emitting device chip 230, which is the upper surface of the light-emitting device chip 230. Furthermore, the lens 290 formed of a transparent material may be formed on the opening 220a. According to circumstances, the lens 290 that is previously prepared may be attached to the molding member 220.

Figure 9:
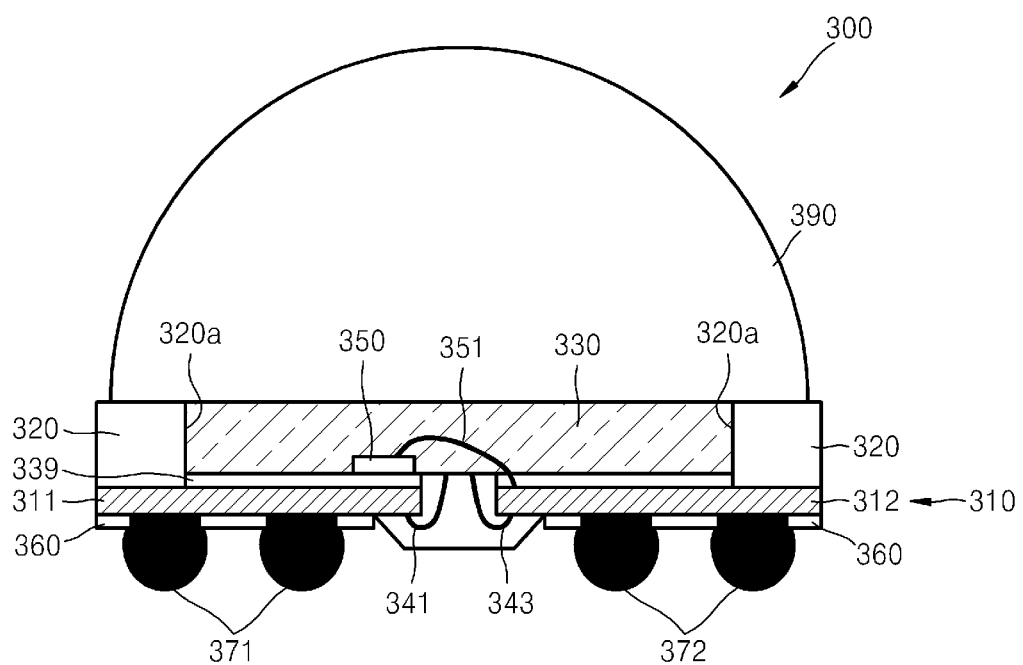
FIG. 9 is a side cross-sectional view of a light-emitting device package according to another embodiment of the present invention.
Figure 10:
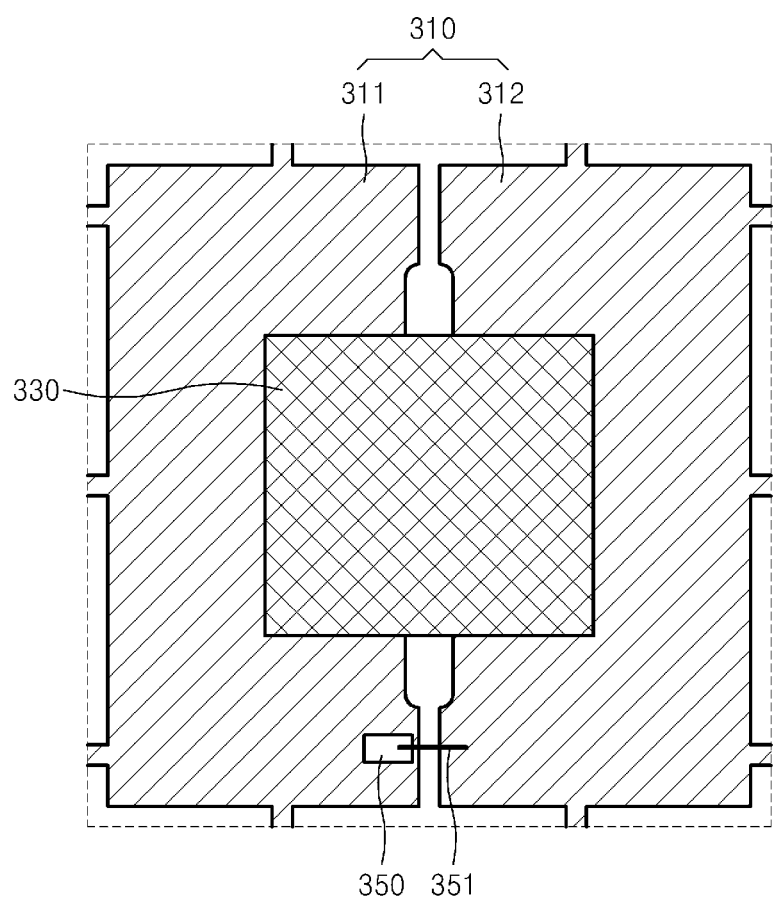
FIG. 10 is a schematic plan view of a wiring substrate and a light-emitting device chip of the light-emitting device package of FIG. 9, according to another embodiment of the present invention.

FIG. 9 is a side cross-sectional view of a light-emitting device package 300 according to another embodiment of the present invention. FIG. 10 is a schematic plan view of a wiring substrate 310 and a light-emitting device chip 330 of the light-emitting device package 300 of FIG. 9, according to another embodiment of the present invention.

Referring to FIGS. 9 and 10, the light-emitting device package 300 includes the wiring substrate 310, the light-emitting device chip 330 and a Zener diode 350 that are mounted on the wiring substrate 310, and a molding member 320 for fixing the wiring substrate 310.

The wiring substrate 310 may be a lead frame including first and second leads 311 and 312 that are separate from each other. The first and second leads 311 and 312 may each be a metal plate having a shape shown in FIG. 10.

The light-emitting device chip 330 is disposed on the wiring substrate 310. Bonding wires 341 and 343 for electrical wiring of the light-emitting device chip 330 are connected to a lower surface of the wiring substrate 310 through a gap between the first and second leads 311 and 312. That is, a die-bonding pad of the light-emitting device chip 330 and a wire-bonding pad of the bonding wires 341 and 343 are disposed on different surfaces. The Zener diode 350 is attached to an upper surface of the wiring substrate 310. A bonding wire 351 is also disposed on the upper surface of the wiring substrate 310. That is, a die-bonding pad of the Zener diode 350 and a wire-bonding pad of the bonding wires 341 and 343 are disposed on the same surface of the wiring substrate 310. An adhesive layer 339 may be formed on the wiring substrate 310 in order to perform a die-bonding method on the light-emitting device chip 230 and the Zener diode 350. A phosphor layer (not shown) may be further disposed on an emissive surface of the light-emitting device chip 330, which is an upper surface of the light-emitting device chip 330. However, if a white light beam does not have to be emitted, the phosphor layer may be omitted. A lens 390 may be disposed on an opening 320a.

As shown in FIG. 9, the molding member 320 seals the wiring substrate 310, except for the opening 320a. In this case, the Zener diode 350 and the bonding wire 351 are disposed outside the opening 320a and are sealed by the molding member 320. Thus, since the molding member 320 seals the Zener diode 350, the opening 320a may be maximally used as an emissive region and a reflective region and the light-emitting device package 300 may be easily miniaturized. Since the bonding wire 351 functioning as a wire of the Zener diode 350 is sealed by the molding member 320, the reliability of the Zener diode 350 may be improved in terms of electrical connection.

The molding member 320 may surround a lateral surface of the light-emitting device chip 330. Since the bonding wires 341 and 343 for electrical wiring of the light-emitting device chip 330 are connected to the lower surface of the wiring substrate 310, a bonding wire pad for electrical connection of the bonding wires 341 and 343 for electrical wiring of the light-emitting device chip 330 does not have to be formed on an upper surface of the wiring substrate 310, and thus, the molding member 320 may be formed to directly contact a lateral surface of the light-emitting device chip 330. Since the molding member 320 is formed to directly contact the lateral surface of the light-emitting device chip 330, the size of an emissive surface of the light-emitting device chip 330, which is an upper surface of the light-emitting device chip 330, may be relatively large. In addition, since a bonding wire pad for electrical connection of the bonding wires 341 and 343 does not have to be disposed around a lateral surface of the light-emitting device chip 330, an entire size of the light-emitting device package 300 may be further reduced.

The light-emitting device package 300 may further include a solder resist 360 formed on the lower surface of the wiring substrate 310, and solder bumps 371 and 372. A solder bump 371 disposed on the first lead 311 of the wiring substrate 310 and a solder bump 372 disposed on the first lead 312 are electrically connected to two electrodes of the light-emitting device chip 330 through the bonding wires 341 and 343, respectively.

Figure 11:
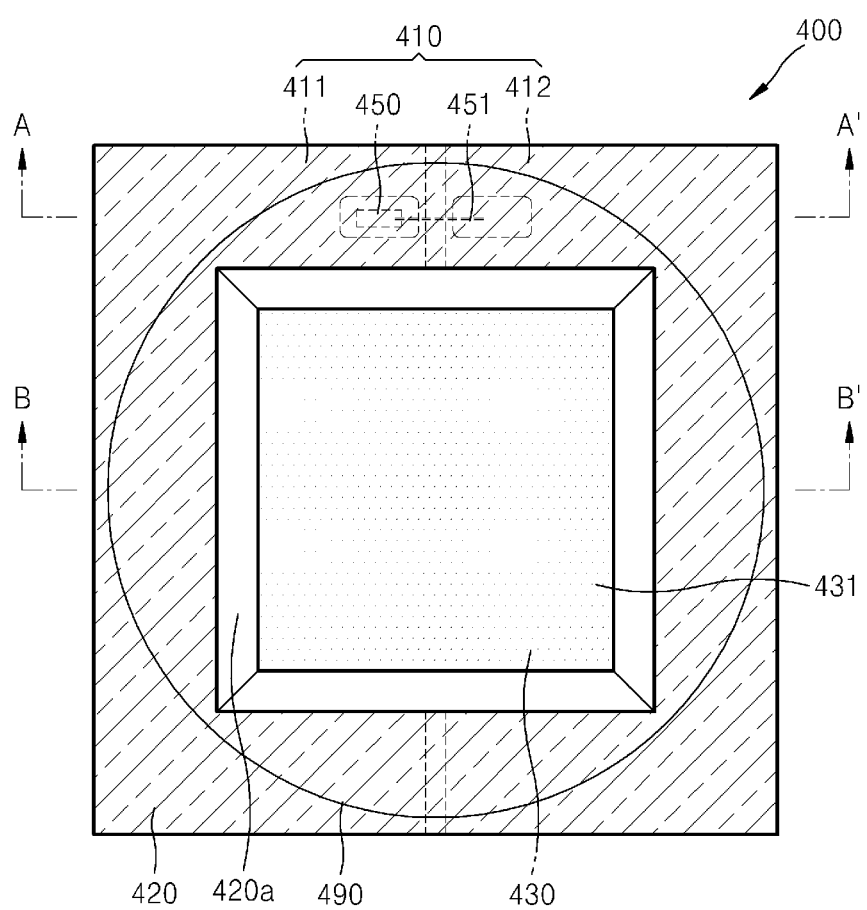
FIG. 11 is a schematic perspective view of a light-emitting device package according to another embodiment of the present invention.
Figure 12:
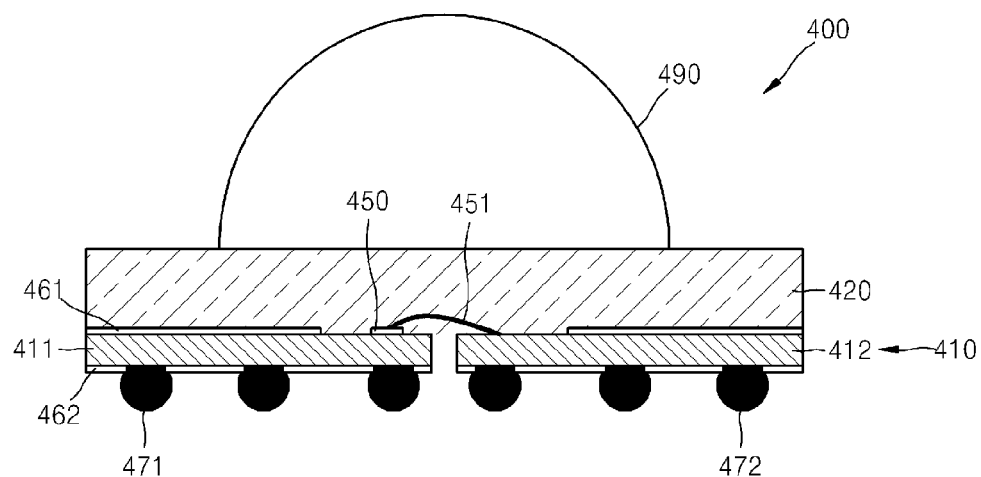
FIG. 12 is a side cross-sectional view of the light-emitting device package taken along a line A-A' of FIG. 11.
Figure 13:
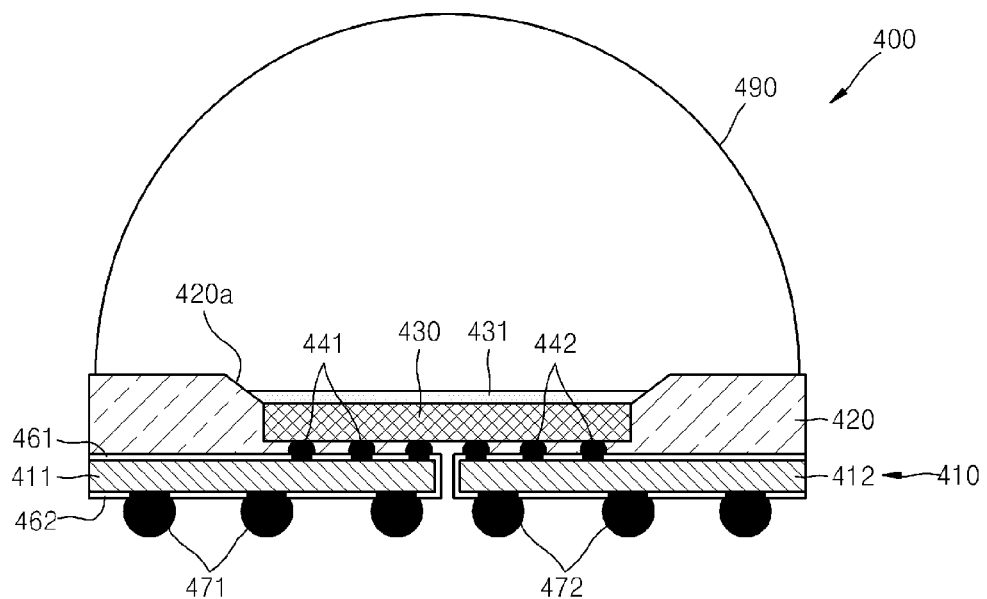
FIG. 13 is a side cross-sectional view of the light-emitting device package taken along a line B-B' of FIG. 11.

FIG. 11 is a schematic perspective view of a light-emitting device package 400 according to another embodiment of the present invention. FIG. 12 is a side cross-sectional view of the light-emitting device package 400 taken along a line A-A' of FIG. 11. FIG. 13 is a side cross-sectional view of the light-emitting device package 400 taken along a line B-B' of FIG. 11.

Referring to FIGS. 11 through 13, the light-emitting device package 400 includes a wiring substrate 410, a light-emitting device chip 430 and a Zener diode 450 that are mounted on the wiring substrate 410, and a molding member 420 for fixing the wiring substrate 410.

The wiring substrate 410 may be a lead frame including first and second leads 411 and 412 that are separate from each other. The first and second leads 411 and 412 may each be a metal plate having a shape shown in FIG. 14A.

The light-emitting device chip 430 is disposed on an upper surface of the wiring substrate 410. The light-emitting device chip 430 is a flip-chip type device. Electrical wiring of the light-emitting device chip 430 is configured in such a way that two electrodes of the light-emitting device chip 430 may directly contact the first and second leads 411 and 412 through two solder bumps. The Zener diode 450 is attached to the first lead 411 of the wiring substrate 410. A bonding wire 451 for electrical wiring of the Zener diode 450 is attached to the second lead 412 of the wiring substrate 310. Solder resist 461 may be coated on the wiring substrate 410 in order to adhere the light-emitting device chip 430 and the Zener diode 450 to the wiring substrate 410. The light-emitting device package 400 may further include solder resist 462 and solder bumps 471 and 472, which are formed on a lower surface of the wiring substrate 410.

A phosphor layer 431 may be further formed on an emissive surface of the light-emitting device chip 430, which is an upper surface of the light-emitting device chip 430. However, if a white light beam does not have to be emitted, the phosphor layer 431 may be omitted. Furthermore, a lens 490 may be disposed on the opening 420a.

As shown in FIG. 11, the molding member 420 seals the upper surface of the wiring substrate 410, except for the opening 420a. In this case, the Zener diode 450 and the bonding wire 451 are disposed outside the opening 420a and are sealed by the molding member 420. Since the molding member 420 seals the Zener diode 450, the opening 420a may be maximally used as an emissive region and a reflective region, and the light-emitting device package 400 may be easily miniaturized. In addition, the bonding wire 451 functioning as a wire of the Zener diode 450 is sealed, and thus, the reliability of the Zener diode 450 may be improved in terms of electrical connection.

Furthermore, the molding member 420 may be formed to surround a lateral surface of the light-emitting device chip 430. Since electrical wiring of the light-emitting device chip 430 is configured by using a flip-chip method, a bonding wire pad for electrical wiring of the light-emitting device chip 430 does not have to be disposed on the wiring substrate 410, and thus, the molding member 420 may be formed to directly contact the lateral surface of the light-emitting device chip 430. Since the molding member 420 is formed to directly contact the lateral surface of the light-emitting device chip 430, the size of an emissive surface of the light-emitting device chip 430, which is an upper surface of the light-emitting device chip 430, may be relatively large, and an entire size of the light-emitting device package 400 may be further reduced.

A method of manufacturing the light-emitting device package 400, according to an embodiment of the present invention, will now be described with reference to FIGS. 14A through 14D.

Figure 14A:
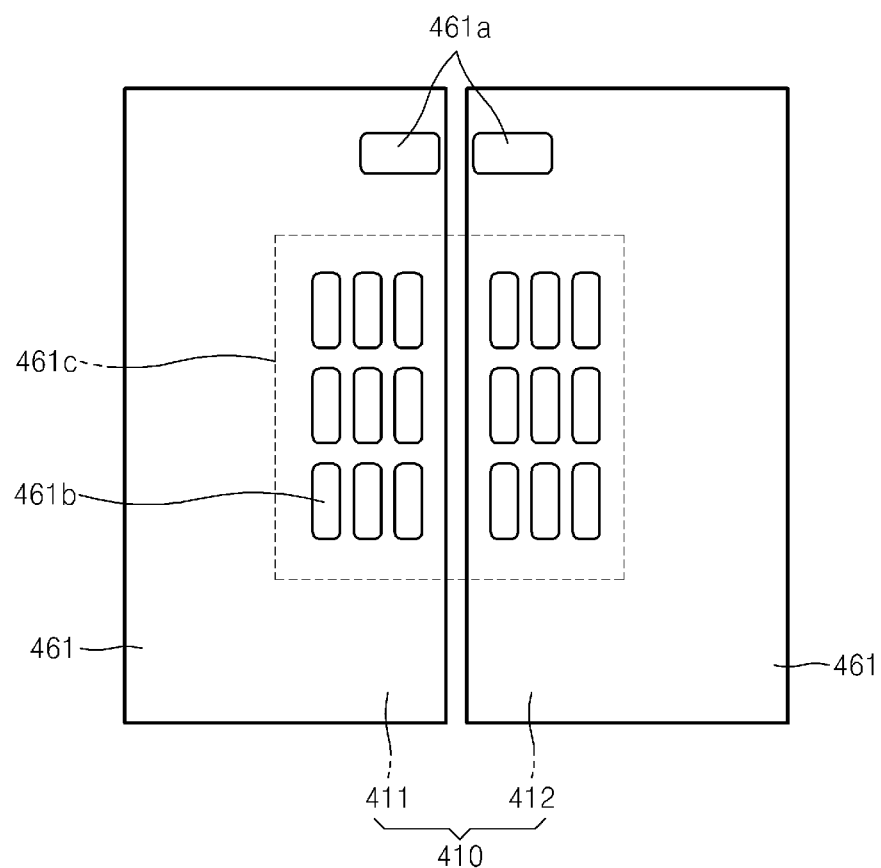

Referring to FIG. 14A, the wiring substrate 410 is prepared. The wiring substrate 410 may be a lead frame that is processed to have a shape corresponding to the first and second leads 411 and 412 by using an etching method. Then, the solder resist 461 is coated on the wiring substrate 410, except for regions 461a and 461b to which the Zener diode 450 and the light-emitting device chip 430 are attached. A reference numeral 461c is a region on which the light-emitting device chip 430 is to be attached.

Then, referring to FIG. 14B, the light-emitting device chip 430 and the Zener diode 450 are attached to the wiring substrate 410. In this case, the light-emitting device chip 430 are directly attached to the first and second leads 411 and 412 of the wiring substrate 410 by using a flip-chip method. A first electrode of the Zener diode 450 is connected to the first lead 411 by attaching the first electrode to the first lead 411, and a second electrode of the Zener diode 450 is connected to the second lead 412 through the bonding wire 451.

Figure 14C:
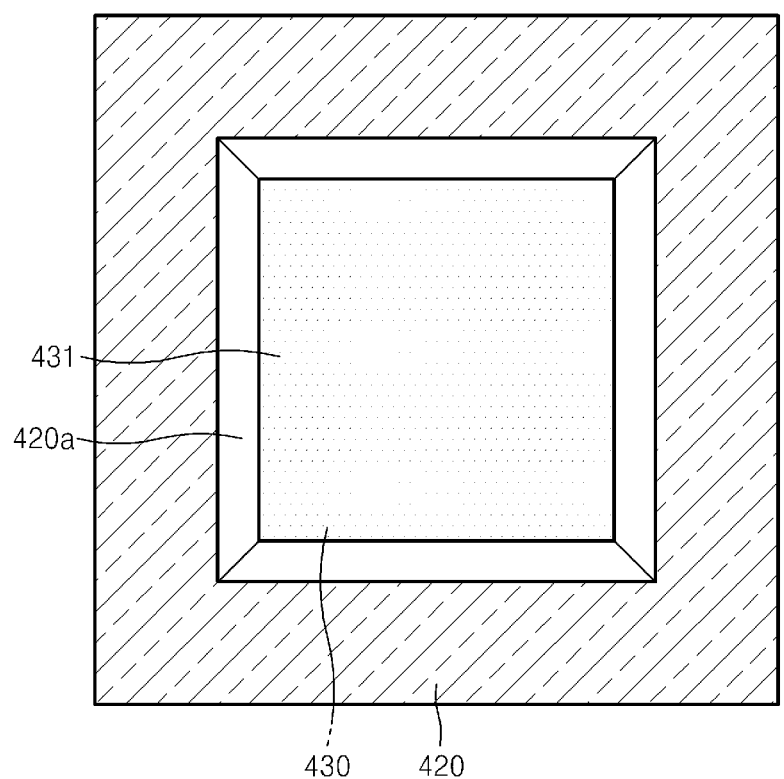
Figure 14D:
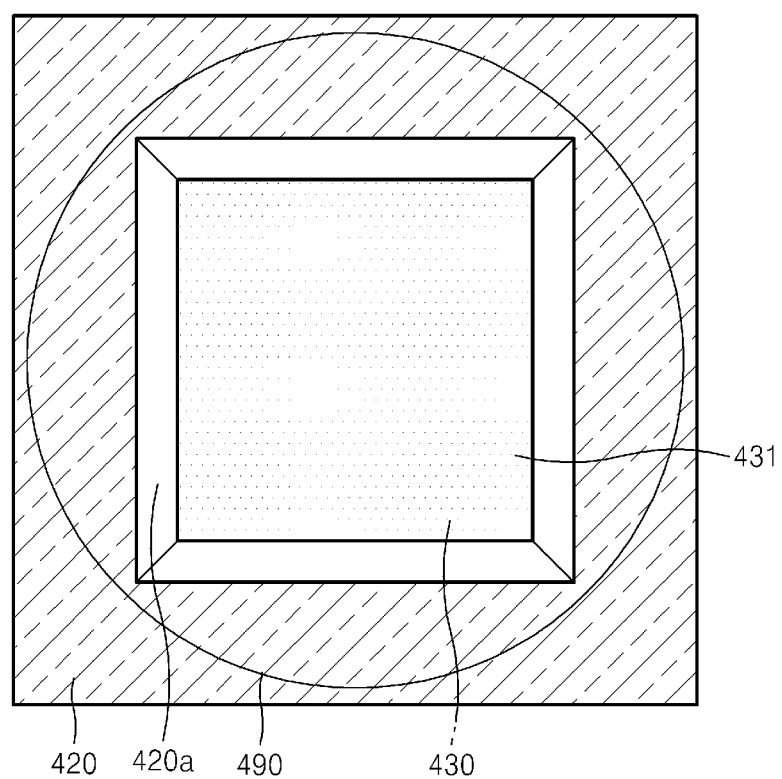

Then, referring to FIG. 14C, the molding member 420 is formed on the wiring substrate 410 by using an injection process. The light-emitting device package 400 is a post-mold type package formed by forming the molding member 420 after the light-emitting device chip 430 is attached. In this case, the molding member 420 may be formed to couple and fix the first and second leads 411 and 412 to each other and to completely seal the light-emitting device chip 430, the Zener diode 450, and the bonding wire 451. The molding member 420 may be formed to directly contact a lateral surface of the light-emitting device chip 430. The opening 420a of the molding member 420 may be formed to be inclined to have a shape of a reflector cup. After the molding member 420 is formed, the phosphor layer 431 may be formed on an emissive surface of the light-emitting device chip 430, which is an upper surface of the light-emitting device chip 430. As shown in FIG. 14D, the lens 490 formed of a transparent material may be formed on the opening 420a by using an injection molding process. According to circumstances, the lens 490 that is previously prepared may be attached to the molding member 420.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A light-emitting device package comprising:
a wiring substrate;
a Zener diode mounted on a first region of the wiring substrate;
a light-emitting device chip mounted on a second region of the wiring substrate, the second region being different from the first region; and
a molding member for fixing at least a portion of the wiring substrate,
wherein the Zener diode is embedded in the molding member.

2. The light-emitting device package of claim 1, wherein the first region of the wiring substrate is formed to be concave with a step difference.

3. The light-emitting device package of claim 2, wherein a depth of the first region of the wiring substrate is the same or greater than a height of the Zener diode.

4. The light-emitting device package of claim 1, wherein the first region of the wiring substrate is concave and bent.

5. The light-emitting device package of claim 1, wherein a connection member for electrically connecting the Zener diode and the wiring substrate to each other is embedded in the molding member.

6. The light-emitting device package of claim 5, wherein the connection member is a bonding wire.

7. The light-emitting device package of claim 1, wherein the molding member surrounds the wiring substrate, except for the second region.

8. The light-emitting device package of claim 7, wherein the molding member is formed to directly contact a lateral surface of the light-emitting device chip.

9. The light-emitting device package of claim 7, wherein an upper surface of the molding member is uniformly formed flat.

10. The light-emitting device package of claim 1, wherein light-emitting device chip is connected to the wiring substrate through a bonding wire.

11. The light-emitting device package of claim 10, wherein the bonding wire is attached to a surface of the wiring substrate, on which the light-emitting device chip is attached, and is embedded in the molding member.

12. The light-emitting device package of claim 10, wherein the bonding wire is attached to an opposite surface to a surface of the wiring substrate, on which the light-emitting device chip is attached.

13. The light-emitting device package of claim 1, wherein the light-emitting device chip is bonded to the wiring substrate by using a flip-chip bonding method.

14. The light-emitting device package of claim 1, wherein at least one through-hole is formed in the first region, the second region, and a third region of the wiring substrate, and the modifying member is filled in the at least one through-hole.

15. The light-emitting device package of claim 14, wherein the at least one through-hole is formed so that an upper portion of the at least one through-hole is wider than a lower portion of the at least one through-hole or the lower portion of the at least one through-hole is wider than the upper portion of the at least one through-hole.

16. The light-emitting device package of claim 1, further comprising a phosphor layer formed on an emissive surface of the light-emitting device chip.

17. The light-emitting device package of claim 1, further comprising a lens disposed on an emissive surface of the light-emitting device chip.

18. The light-emitting device package of claim 1, wherein the wiring substrate comprises at least two leads that are electrically insulated from each other.

19. The light-emitting device package of claim 1, further comprising a solder bump formed on the lower surface of the wiring substrate.

20. A method of manufacturing a light-emitting device package, the method comprising:
 preparing a wiring substrate;
 disposing a Zener diode on a first region of the wiring substrate;
 disposing a light-emitting device chip on a second region of the wiring substrate, the second region being different from the first region; and
 forming a molding member so as to fix the wiring substrate, wherein the Zener diode is embedded in the molding member.

21. The method of claim 20, wherein the preparing of the wiring substrate comprises performing half-etching on the first region of the wiring substrate so that the first region is concave.

22. The method of claim 21, wherein a depth of the first region is the same or greater than a height of the mounted Zener diode or a height of the mounted Zener diode.

23. The method of claim 20, wherein the preparing of the wiring substrate comprises bending the wiring substrate so that the first region is concave.

24. The method of claim 20, wherein the forming of the molding member is performed prior to the disposing of the light-emitting device chip.

25. The method of claim 20, wherein the forming of the molding member is performed after the light-emitting device chip is disposed.

\* \* \* \* \*